US 6,618,816 B1
(12) United States Patent
Ido et al.

(10) Patent No.: US 6,618,816 B1
(45) Date of Patent: Sep. 9, 2003

(54) SYSTEM FOR COMPENSATING DELAY OF HIGH-SPEED DATA BY EQUALIZING AND DETERMINING THE TOTAL PHASE-SHIFT OF DATA RELATIVE TO THE PHASE OF CLOCK SIGNAL TRANSMITTED VIA SEPARATE PATH

(75) Inventors: Meir Ido, Ramat Gan (IL); Joseph Moshe, Herzeliya (IL)

(73) Assignee: ECI Telecom Ltd., Petach Tikva (IL)

( * ) Notice: Subject to any disclaimer, the term of this patent is extended or adjusted under 35 U.S.C. 154(b) by 0 days.

(21) Appl. No.: 09/624,948

(22) Filed: Jul. 25, 2000

(30) Foreign Application Priority Data

Jul. 26, 1999 (IL) .................................................. 131109

(51) Int. Cl.$^7$ .............................. G06F 1/04; H03L 7/00
(52) U.S. Cl. ........................ 713/503; 713/600; 327/163
(58) Field of Search ................. 713/400, 401, 713/500, 501, 503, 600; 327/141, 162, 163, 231, 232, 236; 365/189.05, 230.08; 710/305

(56) References Cited

U.S. PATENT DOCUMENTS

| | | | |
|---|---|---|---|
| 4,744,076 A | | 5/1988 | Elias |
| 5,008,679 A | * | 4/1991 | Effland et al. ............... 342/353 |
| 5,043,596 A | * | 8/1991 | Masuda et al. .............. 327/297 |
| 5,309,035 A | | 5/1994 | Watson, Jr. et al. |
| 5,408,640 A | * | 4/1995 | MacIntyre et al. .......... 713/503 |
| 5,663,661 A | * | 9/1997 | Dillon et al. ................. 326/30 |
| 5,696,951 A | * | 12/1997 | Miller ......................... 713/503 |
| 5,935,257 A | * | 8/1999 | Nishimura ................... 713/503 |
| 6,167,528 A | * | 12/2000 | Arcoleo ....................... 713/501 |
| 6,393,577 B1 | * | 5/2002 | Akamatsu et al. .......... 713/600 |

FOREIGN PATENT DOCUMENTS

| | | | | |
|---|---|---|---|---|
| GB | 2243247 A | * | 10/1991 | ............. H05K/1/14 |
| IE | 80899 B3 | * | 6/1999 | ......... G06F/15/163 |

OTHER PUBLICATIONS

J. T. Vermeulen—"Warp Engine and Ram"—Jun. 1, 1995—Newsgroups: comp.sys.amiga.misc.*
RD 416159 A, Dec. 1998.*
GTL Technology Brochure, Texas Instruments Inc., USA.

* cited by examiner

*Primary Examiner*—Thomas Lee
*Assistant Examiner*—Thuan Du
(74) *Attorney, Agent, or Firm*—Browdy and Neimark, P.L.L.C.

(57) ABSTRACT

Method and circuitry for determining the timing of data arriving to a predetermined point via a data-bus from two or more data sources located at different locations along the data-bus. The timing is initiated by a first clock signal selected from a plurality of clock signals, at a frequency that is transmitted from a first clock generator. For each data source, the total phase-shift of the data relative is equalized to the phase of the transmitted first clock signal. The total phase-shift is determined by transmitting a first clock signal via a separate transmission path and receiving it at the end of the path. The determined total phase-shift is then utilized for enabling data reading.

15 Claims, 3 Drawing Sheets

SYSTEM FOR COMPENSATING DELAY OF HIGH-SPEED DATA BY EQUALIZING AND DETERMINING THE TOTAL PHASE-SHIFT OF DATA RELATIVE TO THE PHASE OF CLOCK SIGNAL TRANSMITTED VIA SEPARATE PATH

FIELD OF THE INVENTION

The present invention relates to the field of data communications. More particularly, the invention relates to a method and apparatus for compensating the timing of data, received through a data-bus printed on a motherboard, that is sent from daughter-boards which are connected to the motherboard at different locations.

BACKGROUND OF THE INVENTION

A data bus is widely used in computer and many data communications systems. A bus is usually implemented by disposing (e.g., printing) a group of data paths on a main printed circuit board called a "motherboard" or a "backplane". Different functional modules that are required for the operation of the system are implemented on separate dedicated printed circuit board called "daughter-boards". Each daughter-board is connected to the motherboard via a connector or a socket, which is located at different location. Data is transmitted to, and collected from each daughter-board via the bus by assigning time slots for each data source so that no more than one data source is transmitting at a time. The data is normally exchanged over the bus at a predetermined data-rate, which is controlled by a clocking circuit. In the operation of a bus which operates at very high speeds, the exact timing of the valid data is very important for their effective operation. For example, for a bus being operated at 100 MHz, a timing error of 10 nanoseconds will result in missing the valid data entirely, and errors less than 10 nanoseconds may also be problematic. At speeds of 100 MHz and above, the time for a signal to propagate along a trace path is not negligible, and must be taken into account.

In a high speed system such as an ATM (Asynchronous Transfer Mode) switch, information is broken up into small fixed cell sizes, which are transferred at high speed. The cells typically consist of 53 bytes or octets, which is composed of a 48 byte payload, and a 5 byte header. Different switches may add local switching information in the form of a header expansion. Each unit on a bus must be prepared to transfer its data, consisting of multiple data bits, when its turn on the bus is allocated. Due to the high speed nature of an ATM system, typically a synchronization signal is sent to the unit at least one clock period in advance, so that there will be no lost time between transmissions on the bus.

One prior art method for compensation of the delay uses a Phase-Locked-Loop (PLL) in each daughter-board to set the internal timing for that daughter-board. The internal timing clock signal of each individual daughter-board (i.e., the signal which determines the timing when data should be sent) is locked to the clock signal received over the mother board. Hence, a proper delay between the received main clock signal and the internal clock can be set individually for each daughter-board by varying the loop parameters until a desired phase-shift (i.e. the desired delay) is obtained. However, using a PLL in each card is cumbersome and costly.

Gunning-Transceiver-Logic (GTL) technology (by Texas Instruments Inc., USA) is a reduced voltage high speed interface standard that provides high-speed point to point data communication at a rate of 75–133 MHz, with a theoretical speed limit of 200 MHz. These data rates are achieved through low voltage swings, and carefully controlled termination that eliminates reflections. GTL technology is however expensive, and is limited to 200 MHz, as it does not compensate for inherent timing losses.

U.S. Pat. No. 4,744,076 discloses a system having a high-speed data communication bus disposed on a motherboard with associated modules that are connected to the motherboard by using removable connections. Modules communicate with the bus through transceiver arrays which are disposed on the motherboard as close as possible to the bus. This enables the removal or the location of modules without affecting the impedance and time delay characteristics of the bus. However, the delays are constant but are not equal for each module, and therefore data sent from each modules appears on the bus with a different timing delay, or phase relationship to the master clock.

U.S. Pat. No. 5,309,035 discloses an active delay regulator that precisely measures the propagation delay of a processed clock signal and maintains a fixed phase difference with relation to an input clock signal. The delay is measured by replicating the internal path delay (i.e., a "replica loop") and passing the input clock signal through a selected tap of a tapped delay line. However, such active regulator (an integrated circuit) is required in each individual data source which feeds a bus, and hence, the system's cost is increased.

All the methods described above have not yet provided satisfactory solutions to the problem of compensating for timing delays of data sent from daughter-boards which are connected to a motherboard at different locations, which is simple and cost effective.

It is an object of the present invention to provide a method and apparatus for compensating the timing of data sent from daughter-boards which are connected to a motherboard at different locations, to essentially equalize the timing, using no additional active component in each daughter-board.

It is another object of the present invention to provide a method and apparatus for compensating the timing of data sent from daughter-boards which are connected to a motherboard at different locations, to essentially equalize the timing, without using phase-locking techniques in each daughter-board.

Other objects and advantages of the invention will become apparent as the description proceeds.

SUMMARY OF THE INVENTION

The present invention is directed to a method for determining the timing of data arriving to a predetermined point via a data-bus from two or more data sources located at different locations along the data-bus. The timing initiated by a first clock signal, is selected from a plurality of clock signals at a frequency f, which are transmitted from a first clock generator. The total phase-shift of the data, relative to the phase of the transmitted first clock signal, is equalized for each data source. The total phase-shift is determined by transmitting a first clock signal via a separate transmission path and receiving it at the end of the path. The determined total phase-shift is then utilized for enabling the reading of the data. Equalization is carried out by generating, for each data source, a first transmission path for receiving the first clock signal and a second transmission path for transmitting data, so that the length of the sum of the first and the second transmission paths is substantially equal for each of the data sources.

Preferably, a data receiving point is determined and a plurality of data transmission paths from the receiving point to each source, forming the data-bus, is generated, where each data transmission path has a specific length. A clock signal transmission path with a unique length, is generated for each source, thereby generating a unique phase shift. The unique length of each of the clock signal transmission paths is substantially equal to the difference between a prefixed length and the specific length of the data transmission path of the each source. The first clock signal is transmitted to the source, and a first clock signal is transmitted via a dummy transmission path of a length which is substantially equal to the prefixed length, thereby shifting the phase of the second clock signal. A second clock generator, which may be part of a phase locked loop, is locked to the phase-shifted second clock signal, and the output of the locked clock generator is used to determine the timing for reading data arriving to the receiving point via the data-bus. Alternatively, a second clock signal at a frequency f/n (n=2, 3, . . . ) is transmitted via the dummy transmission path, so as to shift the phase of the second clock signal. Preferably, the data sources are circuits implemented on printed circuit boards, connected to a main printed circuit board. The transmission paths are traces printed on a printed circuit board.

Optionally, a synchronization pulse is transmitted, prior to data transmission, over a separate transmission path to one of the two or more data sources. The unique length of the synchronization pulse transmission path is substantially equal to the difference between a prefixed length and the specific length of the data transmission path of the source;

The present invention is also directed to a circuitry for determining the timing of data arriving to a predetermined point via a data-bus from two or more data sources located at different locations along the data-bus. The circuit comprises a plurality of data transmission paths, forming the data-bus, from each source to the receiving point, wherein each path has a specific length; a plurality of first clock signal transmission paths, each of which having a unique length being substantially equal to the difference between a prefixed length and the specific length of the data transmission path of the each source; a dummy transmission path having a length which is substantially equal to the prefixed length, and connected to the first clock signal; circuitry for transmitting the first clock signal to each source; circuitry for transmitting data via the data-bus, from each source to the receiving point at a timing being initiated by the first clock signal; and circuitry for reading in the data at the receiving point in response to the timing received over the dummy transmission path.

Preferably, the circuit further comprises circuitry for transmitting a synchronization pulse to each data source, and a transmission path for transmitting the synchronization pulse. The transmission path has a unique length which is substantially equal to the difference between a prefixed length and the specific length of the data transmission path of the each data source.

The present invention is also directed to a data communication system that comprises:

a) a motherboard;
b) one or more daughter-boards which are connected to said motherboard at different locations;
c) a data-bus printed on said motherboard, for receiving data that is sent from said one or more daughter-boards to said motherboard; and
d) circuitry for compensating the timing of said sent data by determining the timing of data arriving to a predetermined point via said data-bus from two or more data sources, located at different locations along said data-bus, to which said one or more daughter-boards are connected.

Preferably, the circuitry for compensating the timing of said sent data comprises:

a) a first clock signal at a frequency f, transmitted from a first clock generator;
b) a plurality of data transmission paths from each source to a receiving point, each of which having a specific length, said plurality of data transmission paths forming said data-bus;
c) a plurality of first clock signal transmission paths, each of which having a unique length being substantially equal to the difference between a prefixed length and the specific length of the data transmission path of said each source;
d) a dummy transmission path having a length being substantially equal to said prefixed length and being connected to said first clock signal;
e) circuitry for transmitting said first clock signal to each source;
f) circuitry for transmitting data via said data-bus, from each source to said receiving point at a timing being initiated by said first clock signal; and
g) circuitry for reading in said data at said receiving point in response to the timing received over said dummy transmission path.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1:
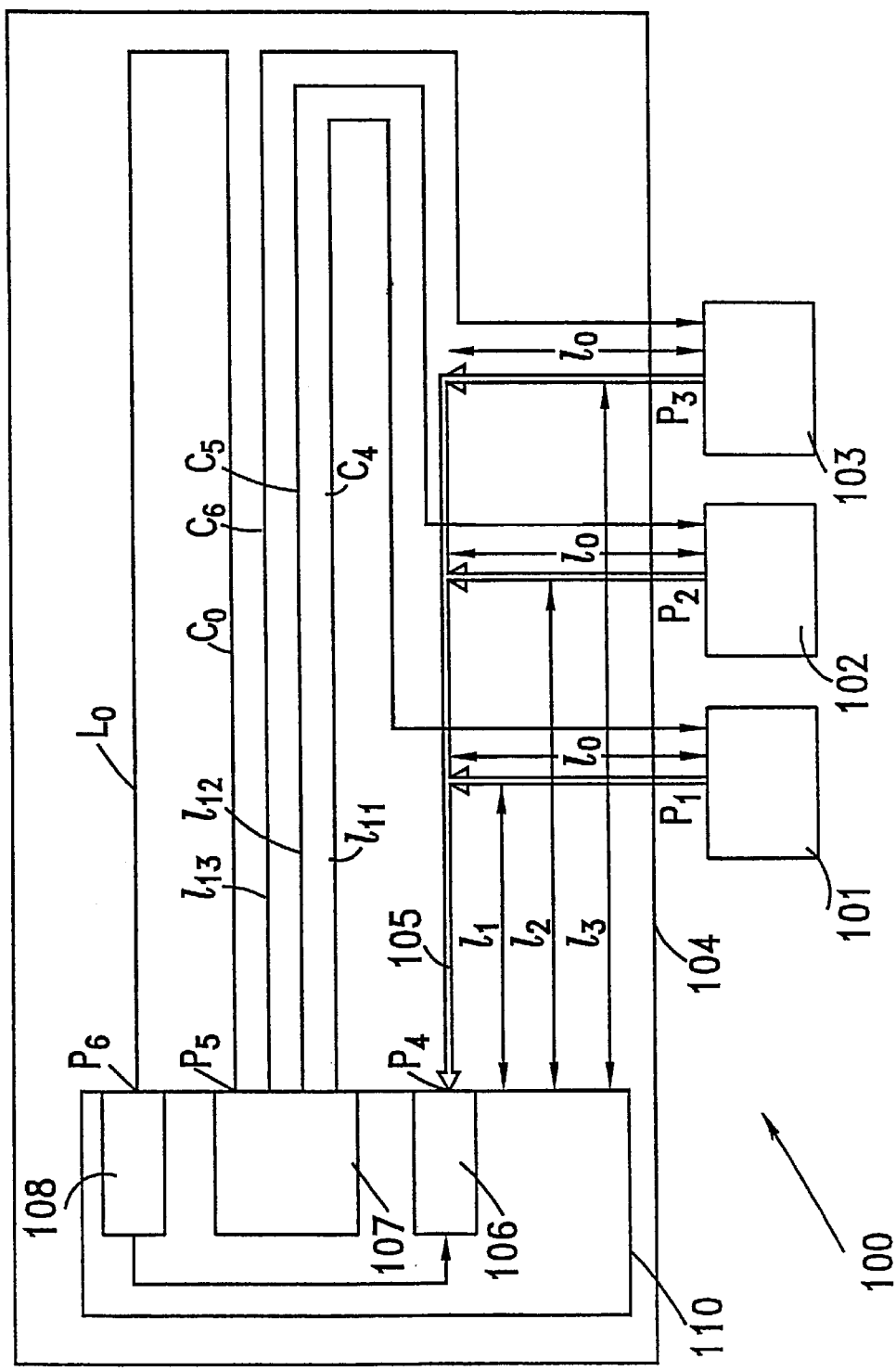
FIG. 1 schematically illustrates a data communication network having a central phase delay compensation, according to a preferred embodiment of the invention.

FIG. 1 schematically illustrates a portion of a data communication system having a central phase, or timing, delay compensation in a main operating card, according to a preferred embodiment of the invention. The system 100 consists of a backplane 104 (the motherboard), three daughter boards, or cards 101, 102 and 103, and main operating card 110 connected to the backplane 104. Other cards may also be connected, however for illustration purposed a non-limiting example of only 8 cards will be utilized. Cards 101, 102 and 103 are connected to the backplane 104 at points $P_1$, $P_2$ and $P_3$, respectively. A data bus 105 collects data from each card and transfers the collected data to a processing circuitry 106, located at a data receiving point $P_4$ on a main operating card 110. A clock signal generator, or distribution unit 107, located on card 110 is also connected to the backplane 104 at point $P_5$. A clock signal is transmitted to Cards 101, 102 and 103 via corresponding individual conducting paths (printed "traces") $c_4$, $c_5$ and $c_6$, respectively. Each clock signal determines the timing for each card in which data should be sent via the bus 105, to the data receiving point $P_4$. The clock signal operates at a predetermined frequency to be understood that bus 105 may carry more than one bit at a time in parallel, and is normally composed of 8 or 16 traces in parallel. Thus in place of one bit, 8, 16 or more bits may be transmitted whenever a single bit is to be transferred.

The data bus 105 exhibits different trace lengths, with a corresponding timing delay, between each card and the data receiving point $P_4$. The equivalent trace length is different from card to card, since each card is located at a different distance from the data receiving point $P_4$. The equivalent trace length of the data bus to Card 101 is the sum of the corresponding lengths $l_0$ and $l_1$. The equivalent trace length of the data bus to Card 102 is the sum of the corresponding lengths $l_0$ and $l_2$. The equivalent trace length of the data bus to Card 103 is the sum of the corresponding lengths $l_0$ and $l_3$, where $l_1 < l_2 < l_3$. If Clock Distribution Unit 107 simultaneously provided a clock signal to each card, the timing of the arrival of the data bits from Card 101 (the closest to $P_4$) will exhibit less delay to the receiving point $P_4$, than the data bit from Card 102. Similarly, the arrival of the data bit from Card 102 will exhibit less delay than the data bit from Card 103. In practice however, the clock is also delayed by the trace from 107 to Card 101, 102 and 103.

According to a preferred embodiment of the invention, compensation is carried out on the backplane 104, by uniquely determining a different length for each clock signal trace, so as to obtain an essentially equal delay time for all the cards. Hence, there is no need for any compensation or correction in each specific card. Additionally the traces on the backplane 104 are relatively consistent, and therefore a lengthening or shortening of one trace due to manufacturing tolerances will be closely matched by an equivalent lengthening or shortening of the other nearby traces.

A uniform value $L_0$ of the total trace length associated with each card is first determined. For each card, the total length $L_0$ consists of the length of the corresponding data bus length and the clock signal trace length associated with that card. For the system shown in FIG. 1, the length of the traces $c_4$, $c_5$ and $c_6$ are $l_{11}$, $l_{12}$ and $I_{13}$, respectively. In the example of FIG. 1, the length $L_0$ has the following relations with respect to each card:

for Card 101: $L_0 = l_0 + l_1 + l_{11}$
for Card 102: $L_0 = l_0 + l_2 + l_{12}$
for Card 103: $L_0 = l_0 + l_3 + l_{13}$ therefore, a consistent trace length, and its consequent consistent timing delay will now exist for each card connected to Backplane 104. In this fashion, the phase of the data bits from each card will be nearly identical.

According to a preferred embodiment of the invention, an additional dummy trace $c_0$ of length $L_0$ is printed on the backplane. The dummy trace $c_0$ is used to simulate the actual total delay, which corresponds to each card. A reference clock signal of frequency f is transmitted over the trace $c_0$ at point $P_5$ from the main operating card 110 onto the backplane 104 (the dummy-trace input). The resulting signal at point $P_6$ (the dummy-trace output) is a phase-shifted reference clock signal. The degree of phase-shift corresponds to the delay of the dummy trace $c_0$, which is equal to the delay caused by the total length $L_0$. The dummy trace output is fed as the reference input to PLL 108, which locks its clock signal to the phase of the received dummy output signal. The output of PLL 108, is used to clock the data into the receiving latch 106 located at point $P_4$. As a result, the clocking signal received at latch 106 has been compensated for all signal trace lengths delays, and the data at point $P_4$ which is clocked into latch 106 will be valid and not corrupted by timing skews.

Figure 2:
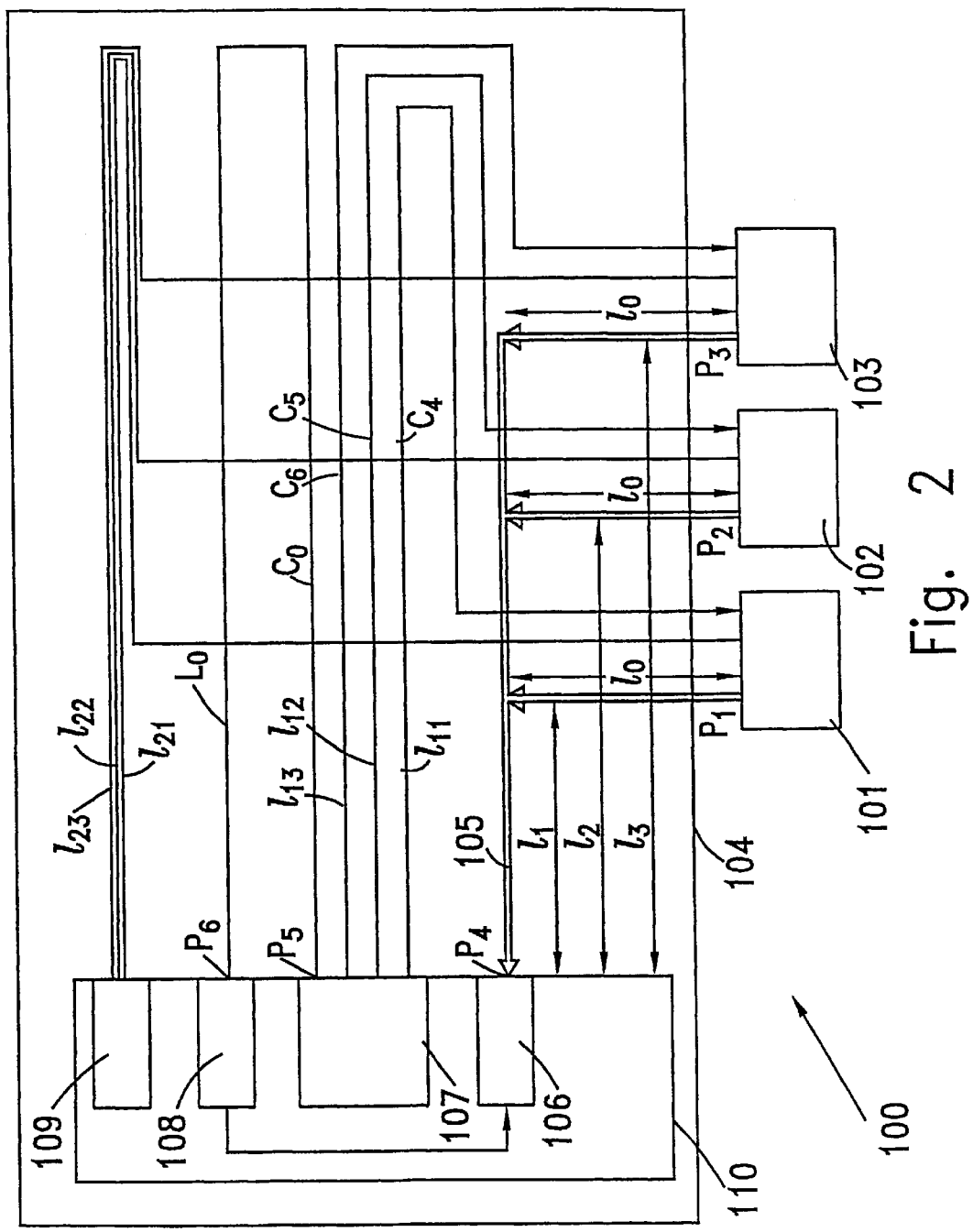
FIG. 2 schematically illustrates a data communication network having a central phase delay compensation, including an addition synchronization pulse trace, according to a preferred embodiment of the invention.
Figure 3:
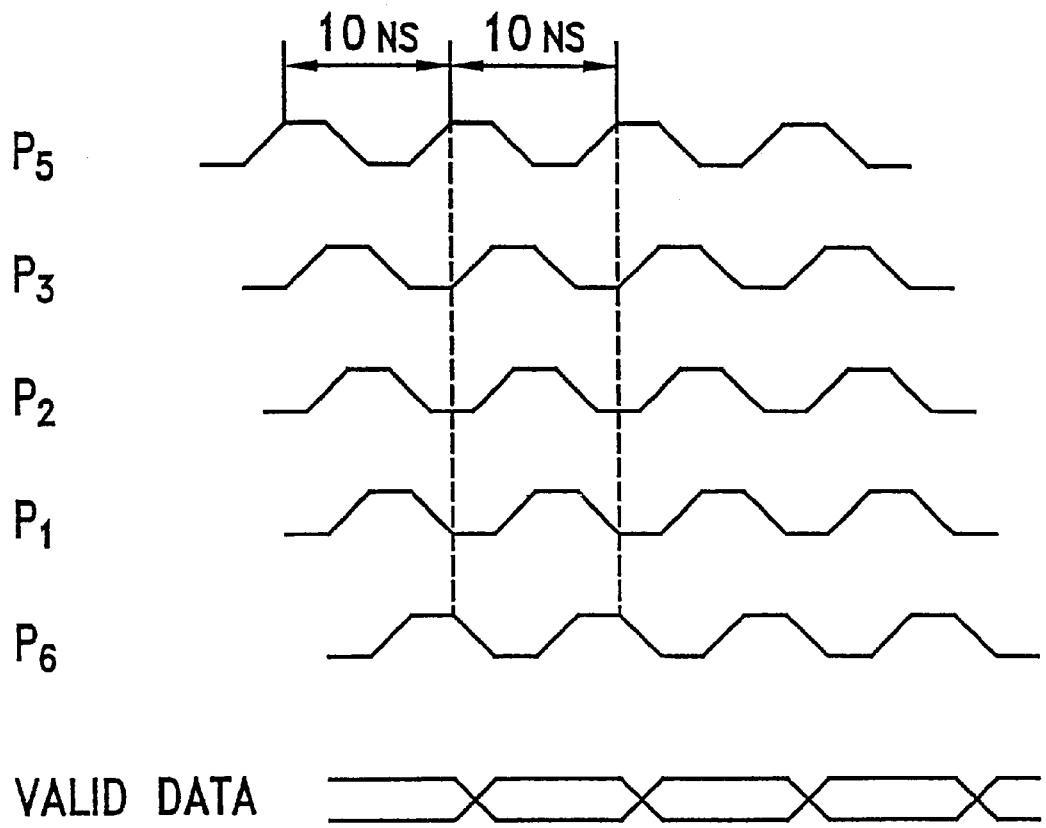
FIG. 3 is a schematic diagram of the phase-shifted clock signals and data validity for each card in the system.

Referring now to FIG. 2, we find a system similar to that shown in FIG. 1, wherein like numbers are used for like parts, and is particularly suitable for use with an ATM cell system. The description of operation is identical with the system shown in FIG. 1, and will therefore not be repeated in detail. Synchronization pulse generator 109 is shown, which generates a pulse one clock period prior to the beginning of a cell period. Cards 101, 102 and 103, are connected to an arbitration mechanism, not shown, which controls which of the cards may transmit onto the bus 105 at each cell period. Thus the synchronization pulse is used to notify the cards 101, 102 and 103, that at the next clock period, the active card is to sent the first bit of information onto the bus. The trace for the synchronization pulse to be sent from generator 109 to cards 101, 102 and 103 is similarly laid out such that the combination of trace lengths is again equal to $L_0$. Thus:

for Card 101: $L_0 = l_0 + l_1 + l_{21}$
for Card 102: $L_0 = l_0 + l_2 + l_{22}$
for Card 103: $L_0 = l_0 + l_3 + l_{23}$ Referring now to FIG. 3, we find a phase diagram depicting the timing of the clock pulses and the data to be received at point P4. The clock is transmitted at 100 MHz, which is equivalent to 10 nS intervals from point P5. The clock is delayed due to the trace length before its arrival at P3, P2 and P1, each by a different amount, resulting in slightly different phases. The clock pulse arriving at P6 has a phase that matches the expected delay $L_0$, as does the valid data arriving at P4 for clocking into latch 106. Thus, by using a clock in phase with P6, valid data is consistently clocked into latch 106.

The above examples and description have of course been provided only for the purpose of illustrations, and are not intended to limit the invention in any way. As will be appreciated by the skilled person, the invention can be carried out in a great variety of ways, employing more than one technique from those described above, all without exceeding the scope of the invention, including but not limited to using a different frequency clock into the dummy trace to obtain the expected phase shift.

What is claimed is:

1. A method for determining the timing of data arriving to a predetermined point via a data-bus from two or more data sources located at different locations along said data-bus, said timing being initiated by a first clock signal selected from a plurality of clock signals, at a frequency f, transmitted from a first clock generator, comprising:

a) for each data source, equalizing the total phase-shift of said data relative to the phase of said transmitted first clock signal;

b) determining said total phase-shift by transmitting a first clock signal via a separate transmission path and receiving it at the end of said path; and c) utilizing said determined total phase-shift for enabling the reading of said data.

2. A method according to claim 1, wherein said equalization is carried out by generating, for each data source, a first transmission path for receiving said first clock signal and a second transmission path for transmitting data, so that the length of the sum of said first and said second transmission paths is substantially equal for each of the data sources.

3. A method according to claim 1, comprising:
a) determining a data receiving point;
b) generating a plurality of data bus paths from said receiving point to each source, each of which having a specific length, said plurality of data transmission paths forming said data-bus;
c) for each source, generating a clock signal transmission path having a unique length, thereby generating a unique phase shift;
d) transmitting said first clock signal to said source, the unique length of each of said clock signal transmission paths being substantially equal to the difference between a prefixed length and the specific length of the data transmission path of said each source;
e) transmitting a first clock signal via a dummy transmission path having a length being substantially equal to said prefixed length, thereby shifting the phase of said second clock signal; and
f) locking a second clock generator at said frequency to the phase-shifted second clock signal, and using the output of said locked clock generator to determine the timing for reading data arriving to said receiving point via said data-bus.

4. A method according to claim 3, wherein a second clock signal at a frequency $f/n$ ($n=2, 3 \ldots$) is transmitted via the dummy transmission path having a length being substantially equal to said prefixed length, thereby shifting the phase of said second clock signal.

5. A method according to claim 1 wherein the data sources are circuits implemented on printed circuit boards, connected to a main printed circuit board.

6. A method according to claim 2 wherein the transmission paths are traces printed on a printed circuit board.

7. A method according to claim 3, wherein the clock generator is part of a phase locked loop.

8. A method according to claim 1, further comprising:
d) prior to data transmission, transmitting a synchronization pulse over a separate transmission path to one of said two or more data sources, the unique length of said synchronization pulse transmission path being substantially equal to the difference between a prefixed length and the specific length of the data transmission path of said source;

9. Circuitry for determining the timing of data arriving to a predetermined point via a data-bus from two or more data sources located at different locations along said data-bus, said timing being initiated by a first clock signal at a frequency $f$, transmitted from a first clock generator, comprising:
a) a plurality of data transmission paths from each source to said receiving point, each of which having a specific length, said plurality of data transmission paths forming said data-bus;
b) a plurality of first clock signal transmission paths, each of which having a unique length being substantially equal to the difference between a prefixed length and the specific length of the data transmission path of said each source;
c) a dummy transmission path having a length being substantially equal to said prefixed length and being connected to said first clock signal;
d) circuitry for transmitting said first clock signal to each source;
e) circuitry for transmitting data via said data-bus, from each source to said receiving point at a timing being initiated by said first clock signal; and
f) circuitry for reading in said data at said receiving point in response to the timing received over said dummy transmission path.

10. Circuitry according to claim 9, further comprising:
a) circuitry for transmitting a synchronization pulse to each data source; and
b) a transmission path for transmitting said synchronization pulse, said transmission path having a unique length being substantially equal to the difference between a prefixed length and the specific length of the data transmission path of said each data source.

11. Circuitry according to claim 9, wherein the data sources are circuit implemented on printed circuit boards, connected to a main printed circuit board.

12. Circuitry according to claim 9, wherein the transmission paths are traces printed on a printed circuit board.

13. Circuitry according to claim 9, wherein the clock generator is a part of a phase-locked-loop.

14. A data communication system, comprising:
a) a motherboard;
b) one or more daughter-boards which are connected to said motherboard at different locations;
c) a data-bus printed on said motherboard for receiving data that is sent from said one or more daughter-boards to said motherboard; and
d) circuitry for compensating the timing of said sent data by determining the timing of data arriving to a predetermined point via said data-bus from two or more data sources, located at different locations along said data-bus, to which said one or more daughter-boards are connected, wherein the circuitry for compensating the timing of said sent data comprises:
a) a first clock signal at a frequency $f$, transmitted from a first clock generator;
b) a plurality of data transmission paths from each source to a receiving point, each of which having a specific length, said plurality of data transmission paths forming said data-bus;
c) a plurality of first clock signal transmission paths, each of which having a unique length being substantially equal to the difference between a prefixed length and the specific length of the data transmission path of said each source;
d) a dummy transmission path having a length being substantially equal to said prefixed length and being connected to said first clock signal;
e) circuitry for transmitting said first clock signal to each source;
f) circuitry for transmitting data via said data-bus, from each source to said receiving point at a timing being initiated by said first clock signal; and;
g) circuitry for reading in said data at said receiving point in response to the timing received over said dummy transmission path.

15. A data communication system comprising:
a) a motherboard;
b) one or more daughter-boards which are connected to said motherboard at different locations;
c) a data-bus printed on said motherboard for receiving data that is sent from said one or more daughter-boards to said motherboard; and
d) circuitry for compensating the timing of said sent data by determining the timing of data arriving to a predetermined point via said data-bus from two or more data sources, located at different locations along said data-bus, to which said one or more daughter-boards are connected, wherein the circuitry for compensating the timing of said sent data further comprises:

a) circuitry for transmitting a synchronization pulse to each data source; and b) a transmission path for transmitting said synchronization pulse, said transmission path having a unique length being substantially equal to the difference between a prefixed length and the specific length of the data transmission path of said each data source.

* * * * *